United States Patent [19]
Manning

[11] Patent Number: 6,147,406
[45] Date of Patent: *Nov. 14, 2000

[54] ELECTRICAL CONNECTION BETWEEN AN ELECTRICALLY CONDUCTIVE LINE AND A NODE LOCATION, AND INTEGRATED CIRCUITRY

[75] Inventor: Monte Manning, Kuna, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/936,095

[22] Filed: Sep. 23, 1997

Related U.S. Application Data

[62] Division of application No. 08/699,828, Aug. 20, 1996, Pat. No. 5,869,391.

[51] Int. Cl.[7] .................................................. H01L 23/48
[52] U.S. Cl. .......................... 257/758; 257/750; 257/756
[58] Field of Search .................................. 257/377, 384, 257/385, 755, 756, 757, 768, 769, 770, 758, 734, 750; 438/275

[56] References Cited

U.S. PATENT DOCUMENTS

| | | | |
|---|---|---|---|
| 5,138,425 | 8/1992 | Ichikawa ................................. | 257/758 |
| 5,168,076 | 12/1992 | Godinho et al. ...................... | 438/384 |
| 5,352,923 | 10/1994 | Boyd et al. ............................ | 257/536 |
| 5,393,689 | 2/1995 | Pfiester et al. ......................... | 438/275 |
| 5,408,130 | 4/1995 | Woo et al. ............................... | 257/758 |
| 5,439,848 | 8/1995 | Hsu et al. ............................... | 437/195 |
| 5,681,778 | 10/1997 | Manning ................................. | 437/186 |
| 5,686,736 | 11/1997 | Natsume ................................. | 257/69 |

OTHER PUBLICATIONS

Wolf, Stanley, Ph.D., "Silicon Processing for the VLSI Era", vol. 1., pp. 181–182, 264–267.

Primary Examiner—Olik Chaudhuri
Assistant Examiner—Alonzo Chambliss
Attorney, Agent, or Firm—Wells, St. John, Roberts, Gregory & Matkin P.S.

[57] ABSTRACT

A semiconductor processing method of making electrical connection between an electrically conductive line and a node location includes, a) forming an electrically conductive line over a substrate, the substrate having an outwardly exposed silicon containing node location to which electrical connection is to be made, the line having an outer portion and an inner portion, the inner portion laterally extending outward from the outer portion and having an outwardly exposed portion, the inner portion having a terminus adjacent the node location, and b) electrically connecting the extending inner portion with the node location. An integrated circuit is also described. The integrated circuit includes a semiconductor substrate, a node location on the substrate, and a conductive line over the substrate which is in electrical communication with the node location. The conductive line includes an outer portion and an inner portion. The outer portion has a terminus and the inner portion extends laterally away from the outer portion terminus and generally toward the node location. The inner portion is in electrical communication with the node location.

17 Claims, 6 Drawing Sheets

ELECTRICAL CONNECTION BETWEEN AN ELECTRICALLY CONDUCTIVE LINE AND A NODE LOCATION, AND INTEGRATED CIRCUITRY

RELATED PATENT DATA

This patent resulted from a divisional application of U.S. patent application Ser. No. 08/699,828, filed Aug. 20, 1996, entitled "Semiconductor Method of Making Electrical Connection Between an Electrically Conductive Line and a Node Location, and Integrated Circuitry", naming Monte Manning as inventor, and which is now U.S. Pat. No. 5,869,391.

TECHNICAL FIELD

This invention relates to an integrated circuit and semiconductor processing methods of making electrical connection between an electrically conductive line and a node location.

BACKGROUND OF THE INVENTION

Single semiconductor devices are grouped into integrated circuits, which in turn are further densified into large scale integrated semiconductor systems. The trend in semiconductor integrated circuitry fabrication continues to involve a decrease in the size of individual structures. However, this has been accompanied by an increase in the complexity and number of such structures aggregated on a single semiconductor integrated chip.

One type of integrated circuitry comprises memory circuitry. This invention arose out of problems or challenges inherent in producing a particular type of memory circuitry, namely static random access memory (SRAMs). Such circuitry typically interconnects a gate of one transistor device to a diffusion area of another transistor device in a semiconductor substrate. One typical prior art method of accomplishing such fabrication and interconnection is described with reference to FIGS. 1–4.

Figure 1:
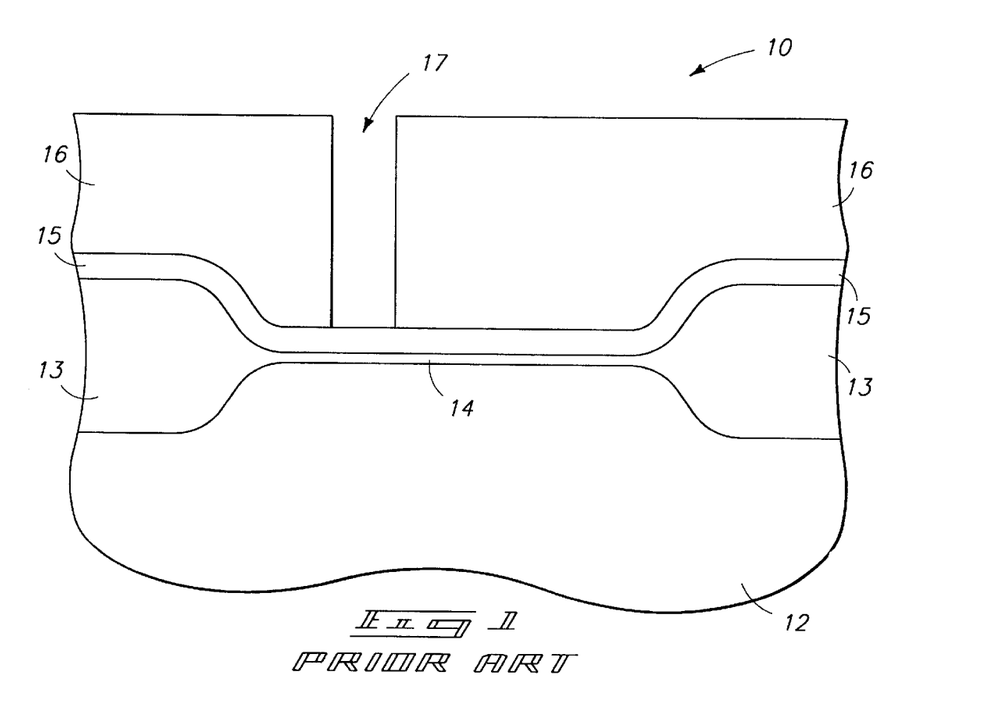
FIG. 1 is a diagrammatic sectional view of a prior art semiconductor wafer fragment at one prior art processing step, and is discussed in the "Background" section above.

FIG. 1 illustrates a semiconductor wafer fragment 10 comprised of a bulk substrate region 12 and field oxide regions 13. A gate oxide layer 14 overlies silicon substrate 12. A polysilicon layer 15 is provided over field oxide regions 13 and gate oxide layer 14. Such will be utilized for fabrication of a transistor gate line of associated SRAM circuitry. A layer 16 of photoresist is provided atop the substrate, and provided with an opening 17 therein.

Figure 2:
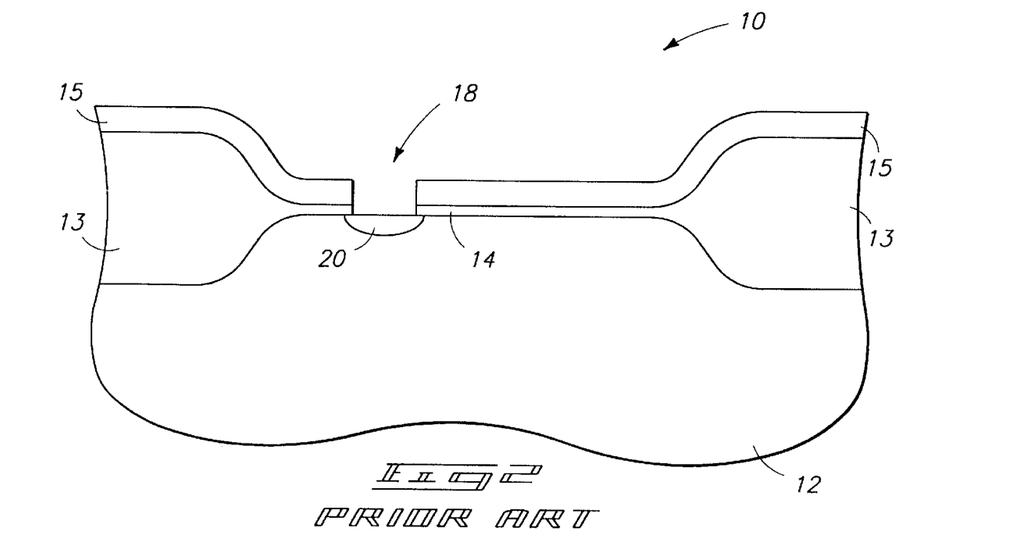
FIG. 2 is a view of the FIG. 1 prior art wafer fragment at a prior art processing step subsequent to that shown by FIG. 1.

Referring to FIG. 2, a contact opening 18 to bulk substrate 12 has been etched through polysilicon layer 15 and gate oxide layer 14. A desired diffusion region 20 is provided as shown. Then, the photoresist layer 16 of FIG. 1 is stripped.

Figure 3:
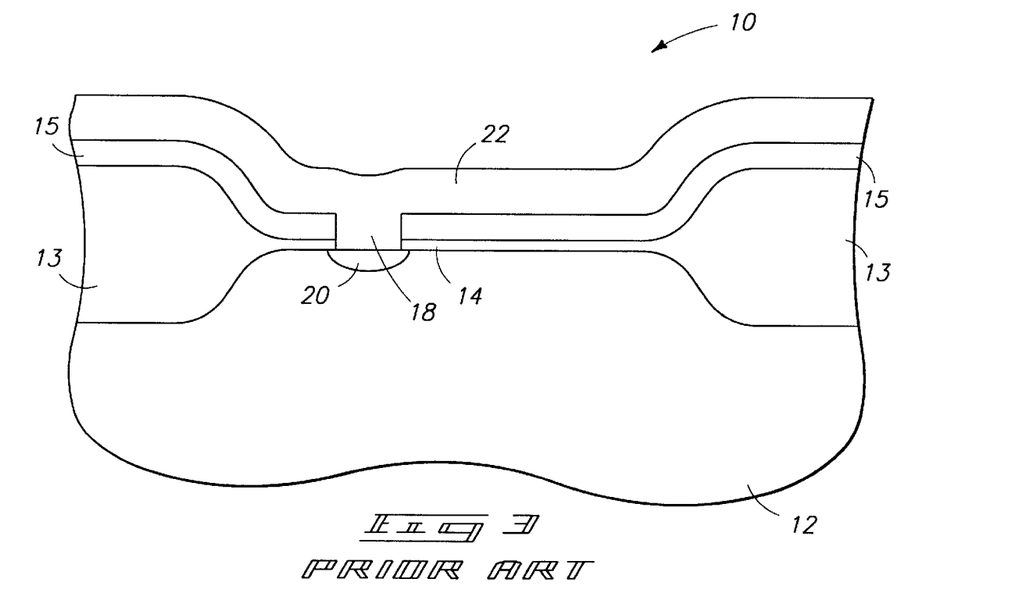
FIG. 3 is a view of the FIG. 1 prior art wafer fragment at a prior art processing step subsequent to that shown by FIG. 2.

Referring to FIG. 3, a subsequent polysilicon layer 22 is deposited over first polysilicon layer 15 and to within contact opening 18.

Figure 4:
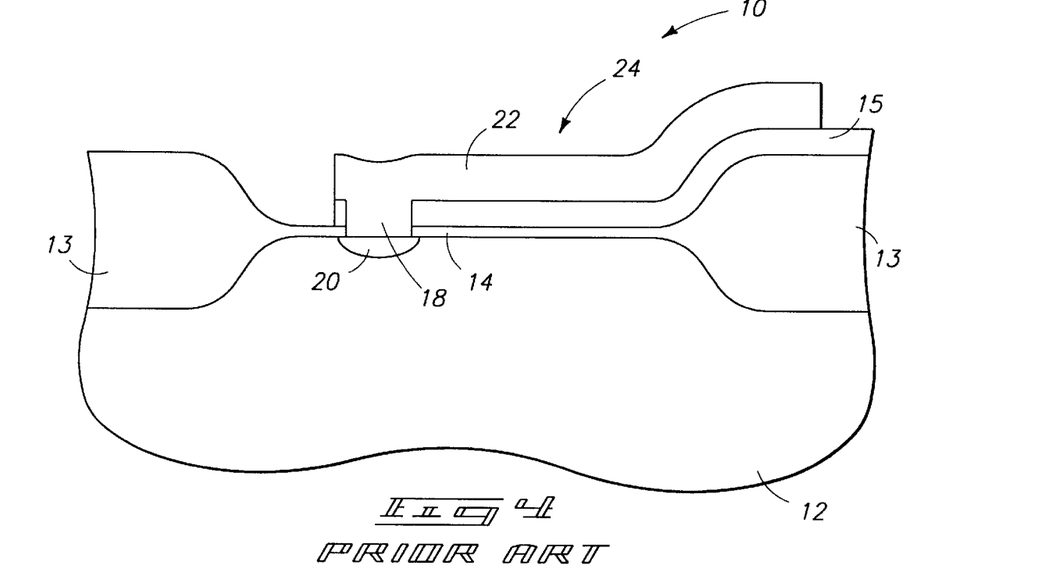
FIG. 4 is a view of the FIG. 1 prior art wafer fragment at a prior art processing step subsequent to that shown by FIG. 3.

Referring to FIG. 4, layers 22 and 15 are patterned and etched to produce the illustrated transistor gate line 24 which extends over and ohmically connects with diffusion region 20.

It would be desirable to improve upon such a construction and method for producing such a construction. The artisan will also appreciate applicability of the invention to fabrication of constructions other than SRAM circuitry.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of making electrical connection between an electrically conductive line and a node location comprises the steps of:

providing a substrate having an outer dielectric surface and a node location to which electrical connection is to be made;

forming a first layer over the outer dielectric surface and the node location;

forming a patterned masking layer over the first layer laterally adjacent the node location;

forming a second layer over the first layer and the patterned masking layer;

patterning and etching the first and second layers and forming an electrically conductive line therefrom, the second layer of the line having a terminus positioned over the patterned masking layer, the first layer of the line forming an extension which extends laterally outward relative to the second layer terminus; and electrically connecting the first layer extension with the node location.

In accordance with another aspect of the invention, a semiconductor processing method of making electrical connection between an electrically conductive line and a node location comprises the steps of:

forming an electrically conductive line over a substrate, the substrate having an outwardly exposed silicon containing node location to which electrical connection is to be made, the line having an outer portion and an inner portion, the inner portion laterally extending outward from the outer portion and having an outwardly exposed silicon containing portion, the inner portion having a terminus adjacent the node location;

forming a metal layer over the exposed inner portion and the exposed node location; and exposing the substrate to conditions effective to form an electrically conductive metal silicide interconnect between the extending inner portion and the node location.

In accordance with another aspect of the invention, an integrated circuit comprises:

a semiconductor substrate;

a node location on the substrate; and a conductive line over the substrate in electrical communication with the node location, the conductive line including an outer portion and an inner portion, the outer portion having a terminus, the inner portion extending laterally away from the outer portion terminus generally toward and in electrical communication with the node location.

Figure 5:
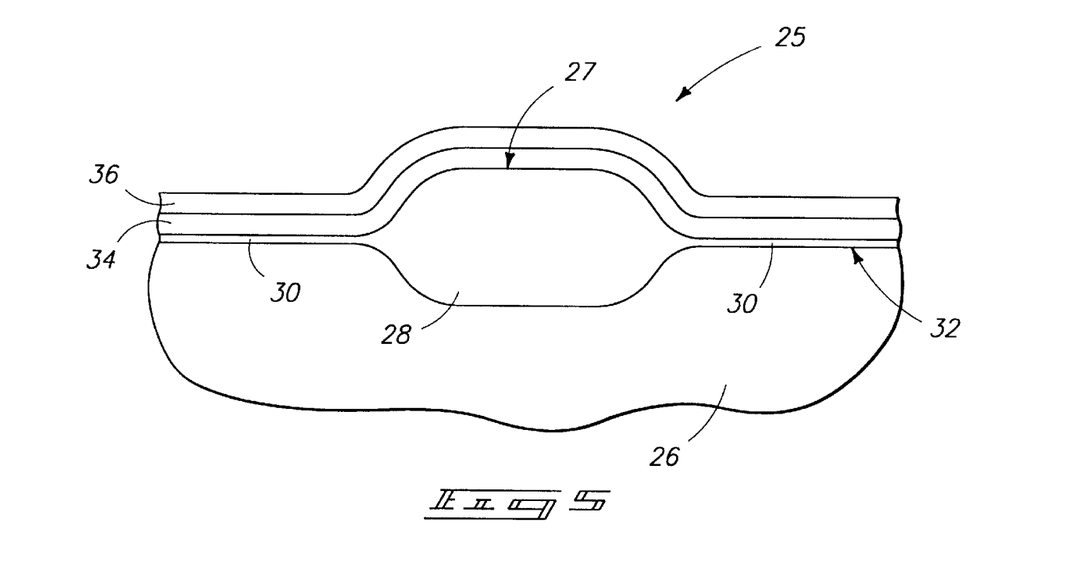
FIG. 5 is a diagrammatic sectional view of a semiconductor wafer fragment at one processing step in accordance with the invention.

Referring to FIGS. 5–11, and first to FIG. 5, a semiconductor wafer fragment in accordance with the invention is indicated generally with reference numeral 25. Such comprises a bulk semiconductor substrate 26 (preferably monocrystalline silicon). Other suitable substrate material such as silicon-on-insulator (SOI) may be utilized in connection with the intention. A field oxide region 28 and gate oxide layers 30 are formed or provided. The field oxide region 28 defines an outer dielectric surface 27 of substrate 26. A node location is indicated generally by reference numeral 32 and defines some location to which electrical connection is to be made. A first layer 34 is formed or provided over the outer dielectric surface and node location, and preferably (comprises conductively doped polysilicon. Preferably, first layer 34 is provided to a thickness of around 700 Angstroms, although a range of thicknesses between about 100 Angstroms to 2000 Angstroms would suffice. First layer 34 may be electrically conductive as formed before a subsequent patterning and etching step, or it may be rendered conductive after provision on dielectric surface 27 as will become apparent below. An etch stop or masking layer 36 is formed over first layer 34 and overlies field oxide region 28 and gate oxide layers 30. A preferred material for etch stop layer 36 is a deposited oxide such as $SiO_2$, and more preferably a TEOS layer having a thickness of about 100 Angstroms. However, other thicknesses from between about 20 Angstroms to 1000 Angstroms will suffice. Other exemplary materials include nitride, aluminum oxide, $TiO_x$, etc.

Figure 6:
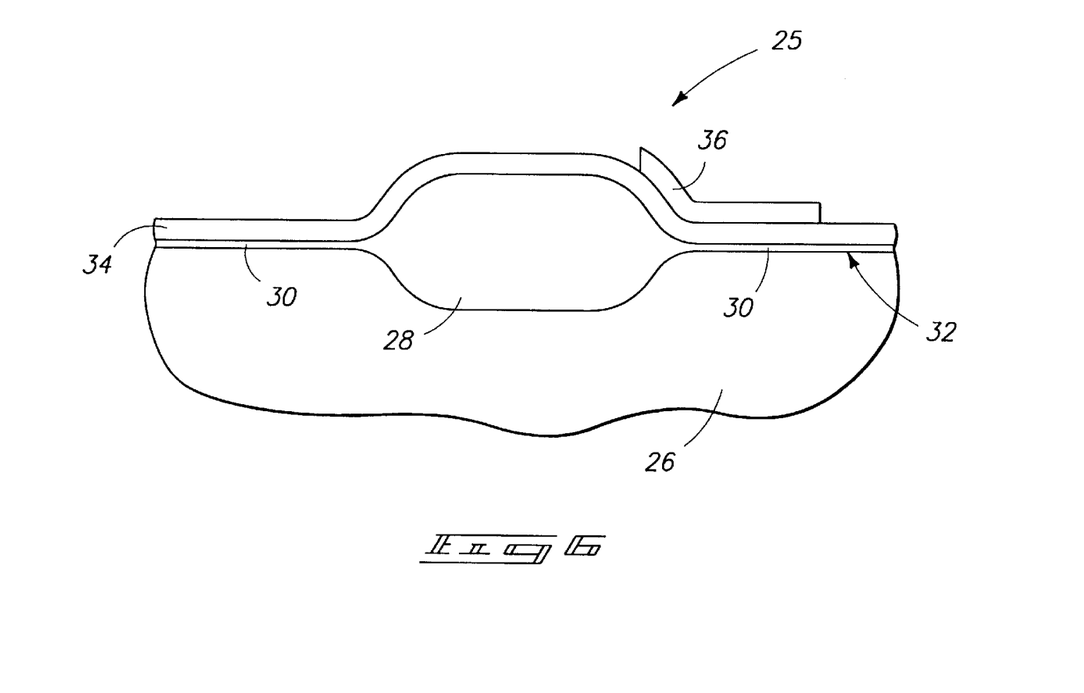
FIG. 6 is a view of the FIG. 5 wafer fragment at a processing step subsequent to that shown in FIG. 5.

Referring to FIG. 6, etch stop layer 36 is patterned and etched to define a patterned etch stop or masking layer (hereinafter designated by referenced numeral 36) to cover desired substrate active areas and leave desired substrate field oxide areas exposed. As shown, patterned etch stop layer 36 is positioned proximate, or laterally adjacent node location 32. The etched layer 36 serves as an etch stop for a portion of the underlying first layer 34 as will be explained below.

Figure 7:
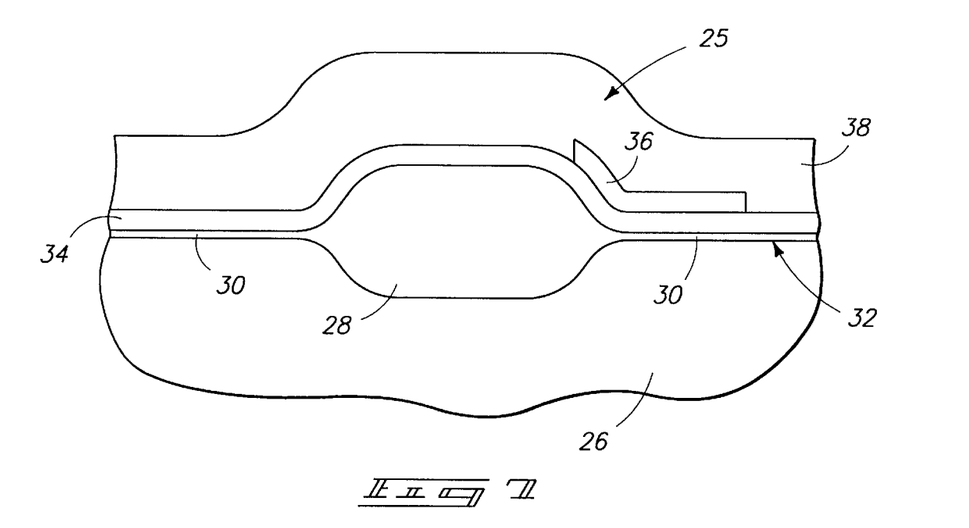
FIG. 7 is a view of the FIG. 5 wafer fragment at a processing step subsequent to that shown in FIG. 6.

Referring to FIG. 7, a second layer 38 is formed over first layer 34 and the patterned etch stop layer 36. Preferably, second layer 38 comprises polysilicon and includes a conductivity enhancing impurity which renders it electrically conductive immediately upon its formation. Layer 38 is preferably formed to a thickness of between about 500 Angstroms to 10,000 Angstroms. More preferably, layer 38 is formed o a thickness of between about 1000 Angstroms to 2000 Angstroms. Most preferably, layer 38 is about 1500 Angstroms thick.

In the preferred embodiment, layers 38 and 34 constitute part of a conductive line and are accordingly electrically conductive. First layer 34 can be rendered electrically conductive in a number of ways. For example, first layer 34 may be in situ doped with a conductivity enhancing impurity during deposition thereby being electrically conductive upon its formation. Alternately, it can be doped after its deposition. Further, etch stop layer 36 can be doped with a conductivity enhancing impurity, with outdiffusion therefrom rendering first layer 34 electrically conductive after provision on the outer dielectric surface and node location. Doping layer 36 as just described creates what is commonly referred to as "doped glass". Doped glass has an additional advantage which stems from its etch rate which is much higher than thermally grown gate oxide. Thus, it is much more easily removed in subsequent patterning and etching steps described below. Other doping options for first layer 34 include that second layer 38 can be provided with sufficient conductivity enhancing impurity, such as phosphorus, that outdiffusion therefrom renders first layer 34 electrically conductive. Further, that portion of first layer 34 which generally underlies patterned etch stop layer 36 can be rendered electrically conductive by lateral diffusion of a conductivity enhancing impurity provided during a subsequent source/drain implant described below.

Figure 8:
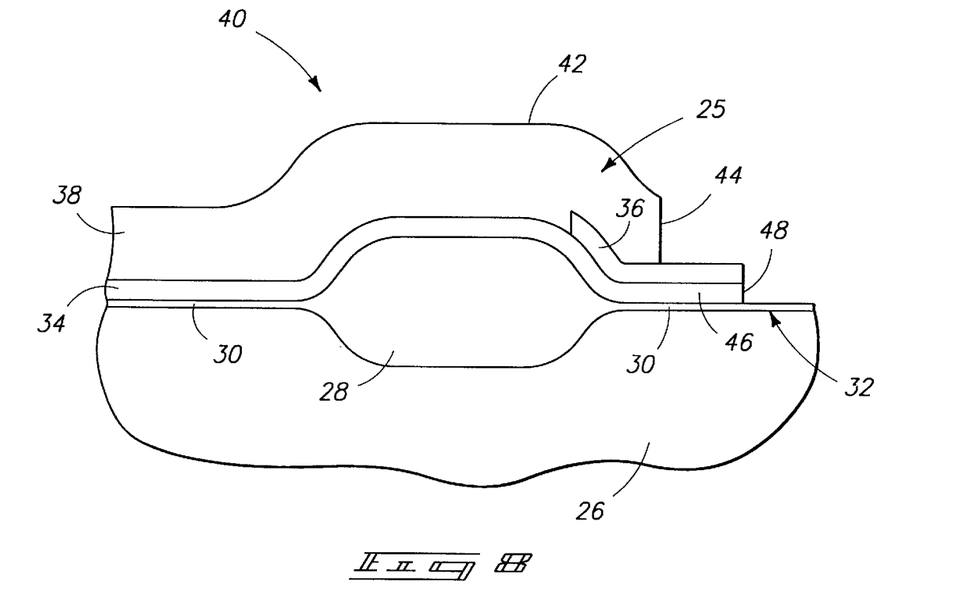
FIG. 8 is a view of the FIG. 5 wafer fragment at a processing step subsequent to that shown in FIG. 7.
Figure 9:
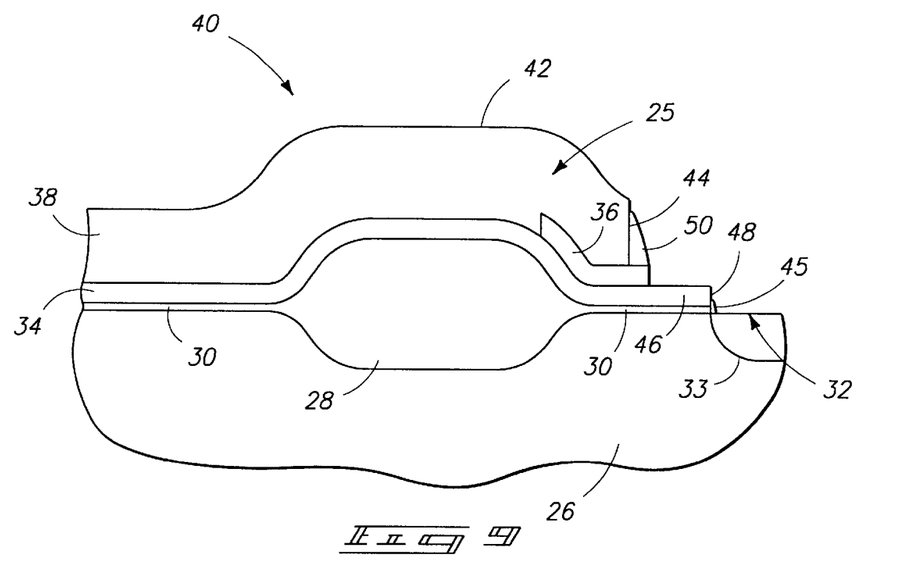
FIG. 9 is a view of the FIG. 5 wafer fragment at a processing step subsequent to that shown in FIG. 8.

Referring to FIGS. 8 and 9, first and second layers 34, 38 are patterned and etched to form an electrically conductive line 40 overlying bulk substrate 26, field oxide 28, and gate dielectric layer 30. The etch also further defines node location 32. As shown, line 40 has an outer portion 42 in the form of layer 38, and has an outer portion or second layer terminus 44 positioned over etch stop layer 36. Line 40 also includes an inner portion in the form of layer 34 having an extension 46) which extends laterally outwardly from outer portion 42 and more specifically outer portion terminus 44. Inner portion 34 includes an inner portion terminus 48 which is located adjacent node location 32. Inner portion terminus 48 directly overlies gate oxide and hence is not yet electrically connected to or with node location 32.

Referring to FIGS. 8 and 9, an insulating material is deposited and anisotropically etched or overetched to form a sidewall spacer 50 over outer portion terminus 44. Such etch also preferably removes that portion of gate dielectric layer 30 which overlies node location 32 and which is not itself covered by etch stop layer 36 and extension 46. Such etch outwardly exposes silicon containing node location 32. Preferably spacer 50 has a lateral width dimension from between around 50 Angstroms to 3000 Angstroms. Even more preferably, spacer 50 has a lateral width dimension of around 1200 Angstroms. Such overetch is preferably (conducted to a point of removing the exposed portion of etch stop layer 36 which is laterally adjacent outer portion terminus 44 and not covered by sidewall spacer 50. Such overetch exposes at least some of the underlying inner portion 34/extension 46 as shown. Such may also leave a spacer 45 which is desirably not entirely covering the inner portion terminus 48. Preferably, first layer 34 is of a sufficient thickness (about 700 Angstroms) so that it retains a remnant thickness after the anisotropic etch of around 300 Angstroms to 400 Angstroms. This is because the anisotropic etch or overetch typically consumes around 100 Angstroms to 300 Angstroms of the first layer. Such thickness is desirable for providing a sufficient amount of polysilicon for a salicide reaction described below. Additionally, first layer 34 is suitably dimensioned to allow spacer 45 to be formed to a preferred height on at least a portion thereof. Such preferred spacer height is less than around 100 Angstroms and facilitates formation of a salicide bridge described below in conjunction with FIG. 10.

Referring still to FIGS. 8 and 9, a desired thickness of layer 36 is one which blocks the etch of the first and second layers 34, 38 (FIG. 8) so that the underlying portion of first layer 34 is protected during the etch described in conjunction with FIG. 8. The desired thickness of layer 36 is also one which minimizes the amount of overetch necessary to clear the exposed portion of etch stop layer 36 overlying first layer 34 and described in conjunction with FIG. 9. Minimizing the amount of overetch required to clear the exposed portion of etch stop layer 36 also minimizes or reduces the etch into that portion of oxide layer 28 which is not covered. Alternatively, though less preferred, etch stop layer 36 may be provided in the form of a heavily doped (e.g. phosphorus doped) PECVD oxide having a high etch rate in HP. If such is the case, then following the first and second layer etch of FIG. 8, a HF dip can be performed to remove the desired portions of the etch stop layer with minimal effect on the underlying oxide regions or layers. At this point, conductivity enhancing impurity can be provided into substrate 26 to form a source/drain region 33 adjacent inner portion terminus 48. Other options for forming region 33 include providing conductivity enhancing impurity into the substrate prior to deposition of first layer 34 as by a masked implant step. Alternatively, conductivity enhancing impurity can be provided into the substrate after deposition of first layer 34 but before deposition of etch stop layer 36.

With respect to layers 34 and 38, the sum of the thicknesses of such layers is preferably one which provides a stable work function for the devices. Typically, a thickness of around 800 Angstroms is sufficient.

Figure 10:
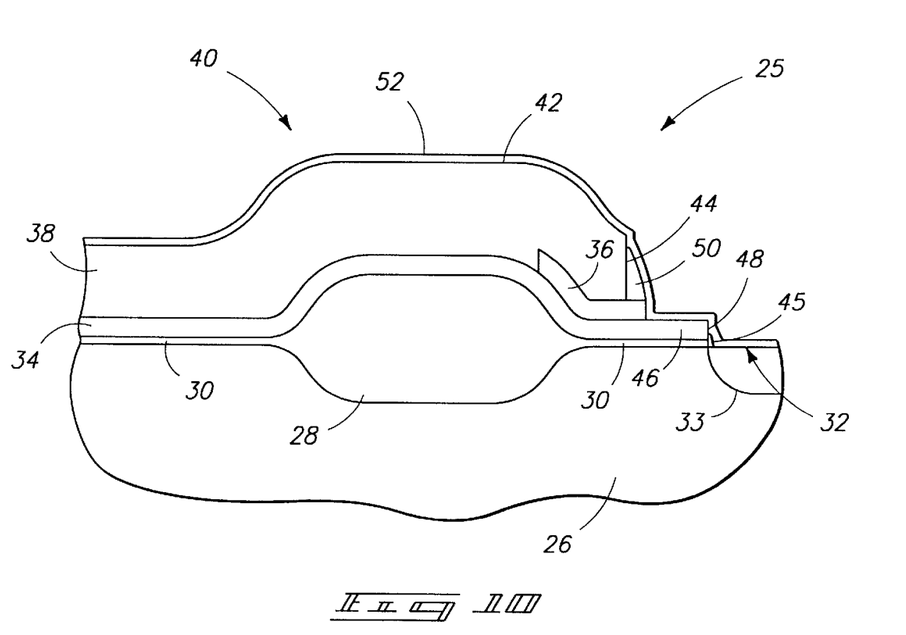
FIG. 10 is a view of the FIG. 5 wafer fragment at a processing step subsequent to that shown in FIG. 9.

Referring to FIG. 10, a conductive refractory metal layer 52 is formed over the exposed inner portion 34/extension 46 and the exposed node location 32, as well as outer portion 42 of conductive line 40. Preferably, layer 52 comprises titanium which is formed to a thickness of between 50 Angstroms and 1000 Angstroms. Even more preferably, layer 52 is formed to a thickness of around 200 Angstroms. Metal layer 52 is used to electrically connect, with node location 32, the portion of inner portion 46 which extends laterally away from outer portion terminus 44. Metals such as nickel, tungsten, platinum, cobalt and other refractory metals may also be used to form layer 52.

Figure 11:
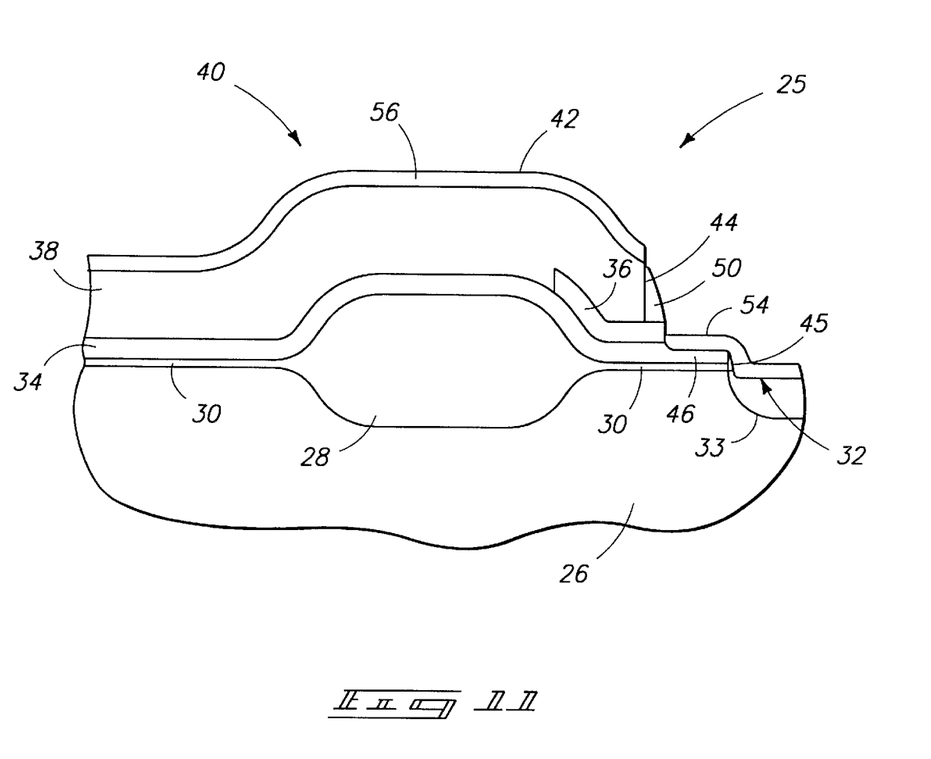
FIG. 11 is a view of the FIG. 5 wafer fragment at a processing step subsequent to that shown in FIG. 10.

Referring to FIG. 11, wafer fragment 25, and accordingly metal layer 52 (FIG. 10), are heated and accordingly exposed to conditions effective to react with the exposed silicon areas and form an electrically conductive interconnecting silicide bridge 54 between the exposed inner portion 34/extension 46 and node location 32. A conventional subsequent selective etch can be used to remove the unreacted metal without attacking the silicide. At this point, if the above-referenced source/drain region was not provided, it could be by provision of conductivity enhancing impurity into the substrate.

As an alternative to forming a silicide layer 56 atop second layer 38, such layer may be capped with a suitable oxide for insulating it from the salicidation process which forms interconnecting silicide bridge 54.

The above-described process essentially provides a conducting line-node interconnecting tongue which extends away from field oxide region 28 and toward node location 32. The conducting tongue or inner portion 46 is in electrical communication with node location 32 by virtue of the interconnecting silicide bridge 54. The conducting tongue forms part of a conductive line 40 which electrically interconnects node location 32 with a gate of another transistor.

Forming a contact between devices as described above eliminates sensitivity to the formation of native oxides over the node location to which electrical connection is being made. Because of this, higher yields are possible. Additionally, incorporation of the above-described contact into SRAM cells provides a smaller cell since the tongue requires less area than the typical buried contact. This is because buried contacts of the prior art utilize an enclosure in polysilicon around the buried contact which adds to the required area. Further, the tongue may be placed within an alignment tolerance of adjacent gate polysilicon areas whereas a buried contact must be spaced away by a distance determined by the resolution of the lithography. This is typically a larger distance than the misalignment tolerance.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. An integrated circuit of claim 1 wherein the node location comprises a diffusion region within the semiconductor substrate.

2. An integrated circuit comprises:
   a semiconductor substrate;
   a node location on the substrate; and
   a conductive line over the substrate in electrical communication with the node location, the conductive line including an outer portion and an inner portion, the outer portion having a terminus, the inner portion extending laterally away from the outer portion terminus generally toward and in electrical communication with the node location, the inner portion having a terminus proximate the node location, insulative sidewall spacers being received over at least parts of the inner portion terminus and the outer portion terminus.

3. An integrated circuit of claim 1 wherein the spacer received over the inner portion terminus covers all of the inner portion terminus.

4. The integrated circuit of claim 1 wherein the spacer received over the outer portion terminus covers a majority of the outer portion terminus.

5. The integrated circuit of claim 1 wherein the spacer received over the outer portion terminus covers a majority of the outer portion terminus.

6. The integrated circuit of claim 1 the spacers received over the inner and outer portion termini have respective maximum lateral thickness, the maximum lateral thickness of the spacer received over the outer portion terminus being greater than the maximum lateral thickness of the spacer received over the inner portion terminus.

7. The integrated circuit of claim 1 comprising a conductive silicide connection electrically connecting the inner portion with the node location.

8. The integrated circuit of claim 1 comprising a conductive silicide connection electrically connecting the inner portion with the node location, and being received over the spacer received over the inner portion terminus.

9. The integrated circuit of claim 1 comprising a conductive silicide connection electrically connecting the inner portion with the node location, and being received over and in physical contact with the spacer received over the inner portion terminus.

10. The integrated circuit of claim 1 comprising:
an insulative layaer received between the outer portion and the inner portion proximate the outer portion terminus and the inner portion terminus; and
a conductive silicide connection electrically connecting the inner portion with the node location, the silicide physically contacting the insulative layer.

11. The integrated circuit of claim 1 comprising a conductive silicide connection electrically connecting the inner portion with the node location, the silicide connection not physically contacting the spacer received over the outer portion terminus.

12. The integrated circuit of claim 1 wherein the insulative spacer covering the outer portion terminus has varying lateral thickness where it covers the outer portion terminus.

13. The integrated circuit of claim 1 wherein the insulative spacer covering the inner portion terminus has varying lateral thickness where it covers the inner portion terminus.

14. The integrated circuit of claim 1 wherein,
the insulative spacer covering the outer portion terminus has varying lateral thickness where it covers the outer portion terminus; and
the insulative spacer covering the inner portion terminus has varying lateral thickness where it covers the inner portion terminus.

15. The integrated circuit of claim 1 wherein the outer most terminus is laterally displaced from the node location.

16. An integrated circuit comprising:
a substate;
a conductive line over the substrate, the conductive line including an outer portion and an inner portion in conductive electrical connection with one another, the outer portion having a terminus, the inner portion having a terminus;
an insulative layer received between the outer portion and the inner portion proximate the outer portion terminus and the inner portion terminus; and
a refractory metal silicide layer in contact with the inner portion and the insulative layer, but not in contact with the outer portion.

17. The integrated circuit of claim 16 wherein the refractory metal silicide layer is in electrical connection with conductively doped semiconductor material remote of the inner portion and the outer portion and proximate thereto.

* * * * *

UNITED STATES PATENT AND TRADEMARK OFFICE
CERTIFICATE OF CORRECTION

PATENT NO. : 6,147,406
DATED : November 14, 2000
INVENTOR(S) : Monte Manning

It is certified that error appears in the above-identified patent and that said Letters Patent is hereby corrected as shown below:

Column 3,
Line 29, please delete "intention" and insert -- invention --.
Line 67, please delete "o" and insert -- "to" --.

Column 4,
Line 36, please delete the ")" after "46".
Line 53, please delete the "(" before "conducted".

Column 5,
Line 18, please delete "HP" and insert -- "HF" --.

Column 6,
Claim 1, should actually be numbered as Claim 2.
Claim 2, should be numbered as Claim 1.

Attachment 1, column 6,
Line 28, please delete "An" and insert -- "The" --.
Line 44, please delete "An" and insert -- "The" --.
Line 49, please delete "a majority" and insert -- "less than all" --.
Line 55, please delete "thickness" and insert -- "thicknesses" --.

Attachment 1, column 7,
Line 5, please delete "layaer" and insert -- "layer" --.

Signed and Sealed this

Twenty-third Day of October, 2001

Attest:

NICHOLAS P. GODICI
Attesting Officer    Acting Director of the United States Patent and Trademark Office